(12) United States Patent
Klafert

(10) Patent No.: US 6,511,795 B2
(45) Date of Patent: Jan. 28, 2003

(54) PROCESS FOR MAKING PICTORIAL REPRODUCTIONS

(76) Inventor: Ralph S. Klafert, 2325 Laharpe St., New Orleans, LA (US) 70119

( * ) Notice: Subject to any disclaimer, the term of this patent is extended or adjusted under 35 U.S.C. 154(b) by 0 days.

(21) Appl. No.: 10/036,248

(22) Filed: Jan. 4, 2002

(65) Prior Publication Data

US 2002/0064732 A1 May 30, 2002

Related U.S. Application Data

(62) Division of application No. 09/779,433, filed on Sep. 23, 1999, which is a division of application No. 09/201,501, filed on Nov. 30, 1998, now Pat. No. 6,150,075.

(51) Int. Cl.⁷ .................................................. G03C 5/56
(52) U.S. Cl. ..................................................... 430/422
(58) Field of Search ......................................... 430/422

(56) References Cited

U.S. PATENT DOCUMENTS 4,584,262 A * 4/1986 Miller ........................ 430/533
5,508,135 A * 4/1996 Lelental et al. ................ 430/63
6,150,075 A * 11/2000 Klafert ........................ 430/320
6,361,612 B1 * 3/2002 Klafert ........................... 134/2

* cited by examiner

*Primary Examiner*—Hoa Van Le
(74) *Attorney, Agent, or Firm*—Keaty Professional Law Corporation

(57) ABSTRACT

A process of transferring a photographic image to a stone surface, such as slate tile, provides for the use of a gelatin subbing solution in a step of preparing the stone surface for the receipt of the image. Additional steps include application of polyacrylic coating and concrete staining material to the surface prior to exposing the surface to the gelatin subbing solution, and using conventional photo developing compounds for permanently affixing a transferred image to the stone surface. Mixing gelatin, chrome alum and water makes the gelatin subbing solution. For an "antique" look, the photograph can be exposed to a sulfide sepia toner prior to transfer of the image to the stone surface.

1 Claim, No Drawings

PROCESS FOR MAKING PICTORIAL REPRODUCTIONS

CROSS-REFERENCE TO RELATED APPLICATIONS

This application is a divisional application of my application Ser. No. 09/779,433 filed on Sep. 23, 1999 entitled "Process for Making Pictorial Reproductions" which is a divisional of application Ser. No. 09/201,501, filed on Nov. 30, 1998, now U.S. Pat. No. 6,150,075 issued on Nov. 21, 2000, the full disclosures of which are incorporated by reference herein.

BACKGROUND OF THE INVENTION

The present invention relates to the art of photography, and more particularly to a process for reproducing photographs or paintings made on paper and similar medium onto a different medium, such as a stone, slate or wall surface.

In the past, slate tiles were extensively used as a roofing material because this product was readily available in many areas of the country. Slate is a type of rock that is readily split along parallel planes of cleavage into large, thin, impervious pieces. These pieces, after trimming, were used to cover a timbered roof. The roofs made with slate tiles were esthetically pleasing and, most importantly, provided good protection against moisture. The service life of such roofs was relatively long, as compared to less expensive alternatives. It was no wonder, therefore, that many buildings in historical districts still have slate tile roofs.

However, some of the buildings with slate tiles are now in such a dilapidated state that renovation is not economically feasible. These buildings are demolished, making room for modern structures and most of the building materials that were used in the construction of the old buildings are removed to a disposal site. Some of the old building materials can be salvaged, such as cypress beams, mantels, doors and the like. The slate roof tiles can also be salvaged with careful handling although they are rarely used again as roofing material.

Most of the salvaged slate tiles are sold through art supply stores, with painters using them as a medium for drawing pictures and selling them as works of art. The painters use oil or watercolors to imprint an image on the slate surface. Such techniques are not suitable for exact reproductions of photographs on the stone surface.

The methods of transferring a photographic or other pictorial work to a hard solid medium have been known before. For example, U.S. Pat. No. 2,180,002 issued on Nov. 14, 1939 to Ford discloses a method of actinic printing of a negative on a bi-chromated gelatin film and reproducing of the photograph on a glass plate. After the film is developed, it is processed through the steps of molding, heating and hardening. A resin body is separated from the mold, and the design of the photograph is shown on the object in reverse reproduction.

U.S. Pat. No. 3,659,327 issued on May 2, 1972 to Berick et al. discloses a process of reproducing a photograph on a article of jewelry, such as a metal charm. The outstanding lines of the object are provided in relief, and the background is infused enamel. U.S. Pat. No. 4,203,789 issued on May 20, 1980 to Delorne discloses a process for reproducing a painting on canvas, wood or similar surfaces. In that process, a copy of the original painting is used to project an image of the painting onto the colored surface. A hardenable paste is then applied to construct imitation relief portions according to the painting. The paste is allowed to harden, and then a flat copy of the paint is applied to the support. The relief portions of that painting show in the flat copy coincident with the imitation relief portions of the support formed by the paste. U.S. Pat. No. 5,547,817 issued on Aug. 29, 1996 to Okada et al. discloses an oxidizing agent for use in a field of silver halide photosensitive material. The oxidizing agent is used as a bleaching agent.

While these patents disclose the general state of the art, none of them address a method of reproducing a photograph on a hard solid surface, such as slate tile. The present invention contemplates provision of a method for reproducing a photograph or other pictorial work onto such medium.

SUMMARY OF THE INVENTION

It is, therefore, an object of the present invention to provide a method of reproducing photographic and other pictorial material on a stone surface, such slate tile.

It is another object of the present invention to provide a method of reproducing photographs and other pictorial representations with the use of a novel subbing solution.

It is a further object of the present invention to provide a composition of matter suitable for use as a subbing solution in a photographic process.

These and other objects of the present invention are achieved through a provision of a process for transferring a photographic image to a stone surface, which comprises the steps of exposing the stone surface to a gelatin subbing solution prior to transferring the image to the surface. Additional steps in preparing the stone surface comprise application of poly-acrylic coating and of concrete staining material before application of the subbing solution. The subbing solution contains an aqueous mixture of gelatin and chrome alum. To impart an "antique" look to the transferred image, the photograph is prepared by exposing the print to a sulfide sepia toner that contains a bleaching solution with potassium bromide and potassium ferric cyanide, and a sulfide solution containing sodium sulfide.

DETAILED DESCRIPTION OF THE PREFERRED EMBODIMENT

According to the process of the present invention, a solid hard material, such as a slate tile is prepared for application of the photographic image. In its natural state, the slate has blue-black or blue-gray color. The surface of the stone, in order to successfully transfer a photographic image is treated in a series of steps designed to make the surface more acceptable to the chemicals traditionally used in photography.

Initially, the stone surface, or the entire slate tile, is thoroughly cleaned and dried. A coating of clear polyacrylic material is applied to the surfaces of the slate, sealing crevices and making the working surface more smooth. The slate with the polyacrylic coating is allowed to dry for up to 24 hours. It is not essential to apply the coating to a non-working surface of the tile. However, this coating may be applied for purely aesthetic purposes and in order to prevent the slate from scratching a surface, on which the finished product is to be positioned.

The dry slate is then examined to determine the area most suitable for application of the photographic image. If it is the center portion that is to be used for reproduction of photograph, then it is advisable to protect the peripheral edges of the slate with a masking tape or similar protective medium. After the tape is secured on the tile a clearly defined working area is formed on the slate tile surface.

The working area is then covered with white concrete staining material, allowing the stain material to penetrate into the surface of the slate tile. The slate is allowed to dry for up to 24 hours after this step. After drying, the working surface of the slate tile no longer has the blue-black or blue-gray color. It has more of a white-gray tint.

While the slate tile is drying, a gelatin subbing solution can be prepared. This subbing solution is used for application in one or two coats on the stained slate tile. To prepare the subbing solution, a 2% chrome alum solution is prepared. The chrome alum solution is prepared by mixing 5 grams of chrome alum in 250 ml of water. Then, about 20 ml of the 2% chrome alum solution are mixed with 5 grams of gelatin and 750 ml of hot water. The resultant composition is thoroughly mixed and applied in one or more coats to the slate tile. If two coats are made, the tile is allowed to dry about 2 hours between the coatings. After the second coating, the slate tile is allowed to dry for 12 hours to ensure that the gelatin coating stabilized and thoroughly adhered to the slate tile.

Following the drying step, a coat of conventional liquid photographic gelatin is applied to the slate. The liquid photographic gelatin is readily available from photo supply stores and does not form a part of the present invention. It is preferred that the application of the liquid photographic gelatin occurs in a darkroom under safe lights to ensure integrity of the coating.

Following the liquid gelatin application, the slate tile is left in a light impermeable container for about 24 hours to dry. This container may be a light-impermeable safe or other similar enclosure. This step concludes preparation of the surface of the slate tile for the transfer of the photographic image. The dry slate tile is placed under an enlarger used in photography, and a photographic image is projected onto the working surface of slate tile.

Once the image is projected on the tile, standard film developing procedures for developing of the image are used. During the image developing procedure, the slate is submerged in a developer bath for 2-minutes, then in a "stop" bath for 1-minute in order to arrest the process of developing of the photographic reproduction process. The slate is then submerged for five minutes in a fixing solution, followed by a 5-minute orbit bath. Finally, the slate is placed in a tub of slow running water for about 1 hour to rinse off the residue of the chemicals used during the developing stage.

The prepared slate with the photographic image imprinted thereon is allowed to completely dry, following which one or two coats of polyacrylic material are applied to the slate to cover the working area where the image has been transferred. The slate is allowed to dry completely for a period of about 24 hours to prevent distortion of the image transferred to the slate.

The present invention also provides for a method of preparing a photograph for transferring to tile surface when sepia look is desired. Conventionally, sepia photographs have brown color and are distinctly different from black and white photographs or color photographs. If the operator wishes to make a slate tile with an "antique" looking image, the photograph must be specially treated prior to the image transfer and developing.

In this process, a bleaching solution is prepared by mixing potassium bromide with potassium ferric cyanide and water. In a preferred embodiment, the bleaching solution is prepared by mixing 50 grams of potassium bromide, 100 grams of potassium ferric cyanide and enough water to make one liter. The resultant concentrate is used at the ratio of 1:9 with water for bleaching the prints.

A stock sulfide solution is also used as part of the toner composition. In the stock sulfide solution, sodium sulfide is mixed with water. In the preferred embodiment, the sulfide concentrate is prepared by mixing 160 grams of sodium sulfide and enough water to make one liter. For use with the bleaching solution, the sulfide concentrate is diluted with water at the ratio 1:9.

In order to prepare the prints with the "antique" look the sulfide sepia toner containing the bleaching toner solution and the stock sulfide solution is prepared. A reproducible print is first bleached for two-three minutes with the bleaching compound. Of course, longer bleaching times can be used, especially for heavy-coated prints. A bleached print would have a faint residual image of the photograph that will become visible when fully toned.

Following bleaching, the print is washed for about 1 minute in running water and then moved into the toning bath. When exposed to the sulfide sepia toner the print darkens in about 1–3 minutes, depending on the quality of the original photograph. The photo is then washed for about 30 minutes under running water. The finished print has a brownish coloring resembling antique photographs. This photograph is then transferred to a slate tile that has been prepared in accordance with the method described above. The image is then developed, also in a manner described above.

The method of reproducing photographic or other images on a hard solid material of the present invention is not restricted to slate tiles. It can be used on many stones, perhaps with the exception of limestone, when the surface of this stone is suitably prepared for transfer of the photographic image. Advantageously, the developing stage of this process does not use the hardener as with conventional photographic processes. The final step, sealing with polyacrylic compound may be performed on a slate tile and on many other stone surfaces, if desired.

While certain ratios of ingredients have been indicated in the preferred embodiment, it will be understood that other ratios will become readily apparent to those skilled in the art. Similarly, drying and developing times set forth above are exemplary, and other periods of time, longer or shorter may be used depending on the environment.

Many other changes and modifications can be made in the process of the present invention without departing from the spirit thereof. I, therefore, pray that my rights to the present invention be limited only by the scope of the appended claims.

I claim:

1. A process for treating surface of an article to increase its receptivity to photographic developing compounds, which comprises:

exposing the surface of the article to a gelatin subbing solution containing gelatin and chrome alum and wherein said gelatin subbing solution comprises about 5 grams of gelatin and about 20 ml of 2% chrome alum solution, mixed with about 750 ml of water.

\* \* \* \* \*